United States Patent
Ho et al.

(10) Patent No.: US 6,586,160 B2
(45) Date of Patent: Jul. 1, 2003

(54) METHOD FOR PATTERNING RESIST

(75) Inventors: Chung-Peng Ho, Austin, TX (US);
Bernard J. Roman, Austin, TX (US);
Chong-Cheng Fu, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/817,408

(22) Filed: Mar. 26, 2001

(65) Prior Publication Data

US 2002/0136992 A1 Sep. 26, 2002

(51) Int. Cl.[7] ................................. G03F 7/20
(52) U.S. Cl. ................. 430/311; 430/396; 430/397
(58) Field of Search ................. 430/322, 396, 430/397, 311; 355/53

(56) References Cited

U.S. PATENT DOCUMENTS

| | | | |
|---|---|---|---|
| 4,869,999 A | 9/1989 | Fukuda et al. | 430/311 |
| 5,742,376 A | 4/1998 | Makinouchi | 355/53 |
| 5,798,937 A * | 8/1998 | Bracha et al. | 364/490 |
| 5,883,700 A | 3/1999 | Someya | 355/53 |
| 6,362,926 B1 * | 3/2002 | Omura et al. | 359/727 |

OTHER PUBLICATIONS

Fukuda et al., "Improvement of Defocus Tolerance in a Half–Micron Optical Lithography by the Focus Latitude Enhancement Exposure Method: Simulation and Experiment," American Vacuum Society, J. Vac. Sci. Technol. B 7 (4), , pp. 667–674, Jul./Aug. 1989.

Spence et al., "Using Multiple Focal Planes to Enhance Depth of Focus," SPIE vol. 1674 Optical/Laser Microlithography V, pp. 285–295 (1992).

* cited by examiner

*Primary Examiner*—Kathleen Duda
(74) *Attorney, Agent, or Firm*—Patricia S. Goddard; James L. Clingan, Jr.; Kim-Marie Vo

(57) ABSTRACT

A resist layer (34) on a semiconductor wafer (20) is patterned by using a scanning exposure system (50) which provides light, containing pattern information which is intended to be transferred to the wafer. The lithographic system is a step and scan system in which a reticle (16) passes between a light source and a lens system(18). The wafer with the resist layer is passed through a focal plane of the patterned light at a tilt angle ($\theta$). The user selects a desirable range for the depth of the resist to be exposed at the focus of the patterned light. The tilt angle is calculated by taking the arc tangent of the desirable range divided by a width of a slit region (52) of the projected light. The depth of focus increases over standard step and scan techniques.

18 Claims, 4 Drawing Sheets

METHOD FOR PATTERNING RESIST

FIELD OF THE INVENTION

The present invention relates generally to methods for manufacturing semiconductor devices, and more particularly to methods for patterning semiconductor substrates.

BACKGROUND OF THE INVENTION

In conventional lithography practices used for manufacturing semiconductor devices, it is common practice to use the same focus position for the entire exposure step. In other words, the field of the semiconductor substrate which is being exposed experiences a common focus depth across the field and this depth is constant during the entire exposure time. A problem with this technique is that when the semiconductor wafer is not sufficiently planar, the image focus cannot be maintained within the entire exposure area. Additionally, the depth of focus (which is the range of the wafer's vertical position relative to the lens where the image contrast is sufficient to create an acceptable feature size) is rather shallow in most lithography processes used in producing advanced semiconductor devices today. A shallow depth of focus means that the process window is narrow or small. In a manufacturing environment, it is preferred to have a more robust process (one which operates under a larger process window) to compensate for variations between numerous tools (e.g. scanners), between wafer lots, and between wafers within a lot.

A technique which was devised to overcome these problems is known as focus latitude enhancement exposure (FLEX). Using a FLEX technique, the exposure process is divided into two or more parts. A first part consists of exposing the entire field area at one focus position. After the first exposure, the wafer is then moved either closer to or farther away from the bottom of the lens (usually by moving the wafer stage up or down) so that the second exposure has a focus position different from the first. By utilizing two or more focus positions in a FLEX process, the depth of focus overall is increased such that the process is more tolerant to 1) variations in topography across the wafer, 2) focal deviation across the field inherent in the projection optics, and 3) errors which may occur in setting the focus.

Although the FLEX process has the advantage of increasing the depth of focus, it also has limitations. For example, the FLEX process is devised to work in conjunction with a step and repeat exposure technique. A step and repeat exposure technique is one in which the entire image field of a reticle is exposed at the same time. After exposure, the wafer is moved in a lateral direction to a new field area. Another exposure occurs through the same reticle but at a new position on the wafer. This process is then repeated until all areas of the wafer have been exposed, thus being called a step and repeat process. For a step and repeat process which utilizes FLEX, the entire image field is exposed at a first wafer position and then again at a second wafer position (different from the first in a vertical direction, i.e. along the optical axis, again usually achieved by moving the wafer stage up or down). Only after exposure at two different vertical positions is the wafer moved laterally to expose a different field area. It should be noted that more than two exposures may be required in the FLEX process to achieve the desired results in certain applications where the depth of focus of the lithography process is extraordinarily shallow relative to the range of focal deviation which needs to be accommodated.

To alleviate the need of excessively large and costly lenses to expose large fields, a technique known as step and scan exposure has evolved. In a step and scan process, exposure is confined to a small area often referred to as a slit. To expose an entire field area of a wafer, the reticle and the wafer are simultaneously, and synchronously, scanned across the slit. This is accomplished by moving the wafer in one lateral direction while moving the reticle in an opposite lateral direction beneath the slit. Traditionally with the step and scan process, the focus position is held constant throughout the exposure and across the entire field. Accordingly, it has a shallow depth of focus (and all the drawbacks associated therewith as explained above) and it cannot maintain adequate focus if the wafer topography is not sufficiently planar. For example, existing step and scan tools often can not achieve a depth of focus which is sufficient for defining critical dimensions in the 130 nm (0.13 $\mu$m) node as defined by the International Technology Roadmap for Semiconductors (ITRS).

To broaden the depth of focus using a step and scan technique, one may implement a FLEX technique. However, to do this would require scanning the entire exposure area two or more times, once at the first focus position and then again at each other focus position. Repetitive scanning is inconsistent with desired manufacturing principles of lowering cycle time and increasing throughput. Repetitive scanning is also undesirable because it increases the possibility of a registration error between the first and subsequent exposures.

Another way in which the benefits of FLEX can be integrated into a step and scan process is taught by U.S. Pat. Nos. 5,883,700 and 5,742,376. These patents describe very similar approaches for broadening the depth of focus in a step and scan system, namely oscillating the wafer along the optical axis during the scan. The oscillation occurs at a frequency of at least 30 Hz in the state-of-the-art systems today, and very likely even higher in the future systems. There are several disadvantages to this technique. First, high frequency oscillation of the wafer stage may adversely impact the stability in the scanning dynamics. Furthermore, these systems will be quite costly to a semiconductor manufacturer, requiring new scanner systems because oscillating mechanisms do not exist in the scanning systems of today.

Therefore, a need exists in the industry to improve the step and scan exposure process by increasing the depth of focus achievable without suffering penalties associated with cycle time and throughput and without susceptibility to registration errors. It is also desirable for such a process to be accomplished without expensive modifications to existing scanning systems and without potentially harmful wafer stage oscillation.

DETAILED DESCRIPTION OF A PREFERRED EMBODIMENT

The present invention provides a method for patterning a semiconductor wafer which utilizes a step and scan exposure technique but which has the benefit of having a broader depth of focus than conventional step and scan techniques. In one form, this is achieved by tilting and raising (or by tilting and lowering) the wafer during the scanning process. By tilting the wafer, in conjunction with changing the position of the wafer along the optical axis (e.g. by raising or lowering the wafer), every point within the exposure area is exposed to a continuously varying focus position. Therefore, as in a FLEX exposure process, the depth of focus is enhanced. But unlike the FLEX process, the broader depth of focus is achieved without scanning the image area multiple times. The present invention achieves all the advantages of FLEX but with a single scan across the image area and without potentially harmful wafer oscillations.

The present invention can be better understood from the following detailed description taken in conjunction with FIGS. 1–8. It is noted that the drawings are not necessarily drawn to scale, and furthermore that there may be other embodiments of the invention not specifically illustrated.

Figure 1:
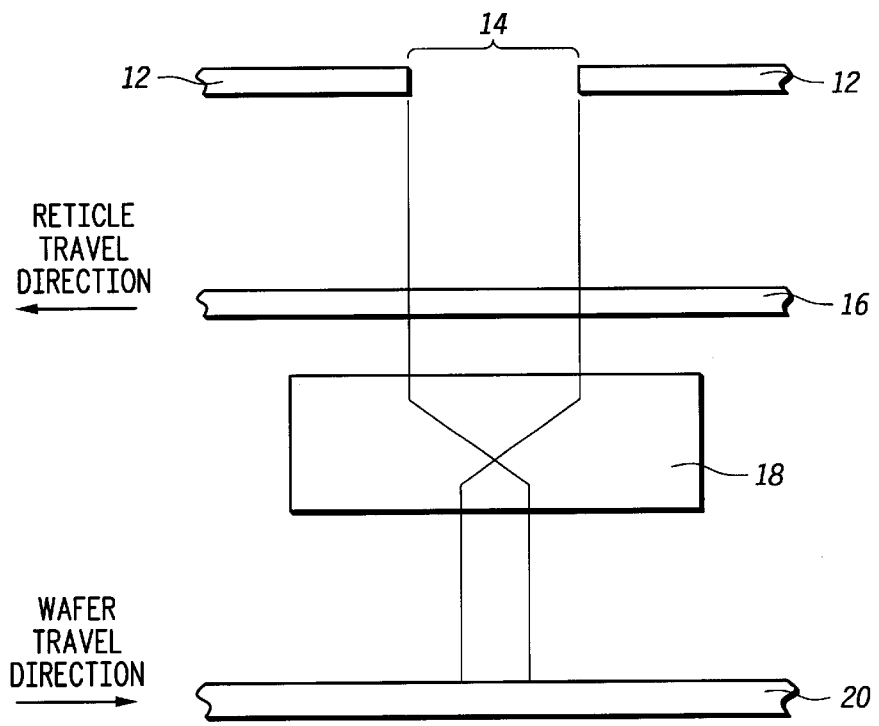
FIG. 1 illustrates a step and scan exposure system in accordance with the prior art.

FIG. 1 illustrates a conventional step and scan exposure system 10. System 10 includes mask blades 12 which form a slit 14. A light source (not shown) provides light through slit 14 which passes through a reticle (also known as a photomask) 16. Reticle 16 includes an image pattern which ultimately is replicated onto a semiconductor wafer 20, or other type of substrate which can be patterned via lithography, through a projection lens system 18. In a traditional step and scan exposure process, the "scan" is achieved by moving the reticle in one direction (as illustrated, the reticle moves toward the left) while at the same time moving the wafer in the opposite direction (as illustrated, the wafer moves to the right).

Figure 2:
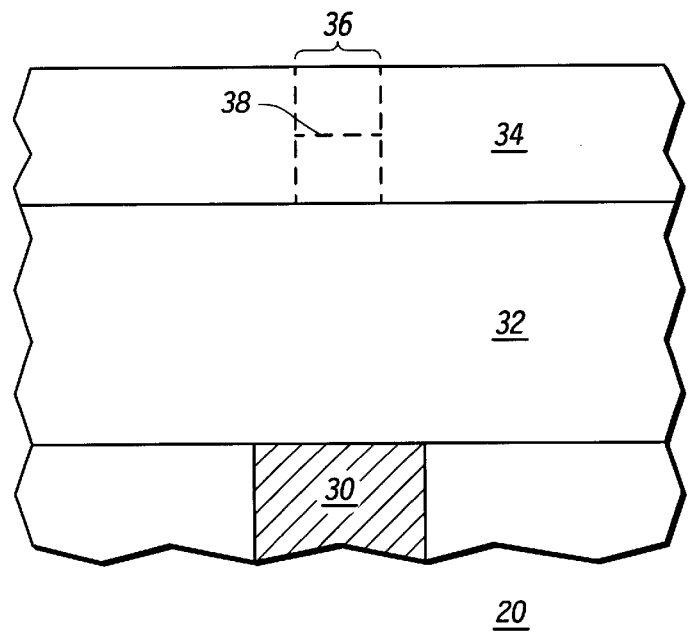
FIG. 2 is a cross-sectional view of a portion of a semiconductor wafer demonstrating the effects of using the step and scan exposure system of FIG. 1.

FIG. 2 illustrates a small portion of semiconductor wafer 20. This portion includes a conductive region 30, a dielectric layer 32, and a resist layer 34. For purposes of illustrating the present invention, the particular lithography process described will be related to forming a contact to conductive region 30 within semiconductor wafer 20. However, it should be understood to one of ordinary skill in the art that the present invention is not in any way limited to patterning contacts, but can instead be applied to any lithography process throughout the semiconductor manufacturing sequence.

To make a contact to conductive region 30, an opening must be made in dielectric layer 32. This is achieved by patterning resist layer 34. Resist layer 34 is patterned by selectively exposing portions of resist layer 34 to light, thereby rendering these portions of the resist layer soluble in a developer solution. Upon forming a patterned resist layer, portions of dielectric layer 32 will remain covered by the resist layer but other portions will be uncovered. These uncovered portions are then etched to form a contact opening in dielectric layer 32, while remaining portions will be protected by the patterned resist layer and will not be etched. After forming the contact opening in dielectric layer 32, a conductive material is deposited into the contact opening to make electrical contact to conductive region 30.

For purposes of describing the present invention, assume that resist layer 34 will be exposed to light within an exposure area 36. The position of exposure area 36 corresponds to the region of wafer 20 in which a contact opening needs to be formed in dielectric layer 32 so that contact can be made to conductive region 30. In a conventional step and scan exposure process, the light is optimally focused at a fixed distance from lens system 18. This distance generally will correspond to a depth within resist layer 34. For purposes of illustration, the optimum focus point within resist layer 34 in FIG. 2 is represented by a dashed line, and is label with reference numeral 38. The optimum focus point corresponds to the point in the exposure region in which the image contrast is greatest. In actuality, rather than being a point it will be a plane since light is passing through an entire area defined by slit 14. The image of this area produced by this light will be "best focused" along line 38 within the resist layer. Above this plane (i.e. above line 38), as well as below this plane, the image contrast is degraded. While degraded, the image contrast can nonetheless be sufficient to adequately expose the resist so that it may be developed and removed to define a contact opening window in the resist layer. However, at some point, the deviation from the optimal focus plane is so large that the image contrast becomes insufficient to adequately expose the resist. Accordingly, there is an acceptable "focus window" around the optimal focal plane in which the exposure process must take place in order to effectively expose the resist so that all contact openings across the wafer are adequately defined.

Because the location of the optimal focus point or plane is fixed relative to the lens, variation in resist thickness or wafer planarity may cause the exposure process to occur outside of the acceptable focus window. As a result, certain areas of the resist are not sufficiently exposed and therefore are not developed to acceptable feature sizes. In some instances the resist is not even completely dissolved in the developer, which in turn fails to produce a contact opening through subsequent etch.

As mentioned previously, one way to broaden the focus window or depth of focus is to use a FLEX technique in which the wafer is exposed two or more times, each exposure having the wafer at a different distance from the lens. But when used in conjunction with a step and scan exposure process, the FLEX technique undesirably increases cycle time and reduces throughput because it requires the field area be scanned two or more times, once at each different distance.

Figure 3:
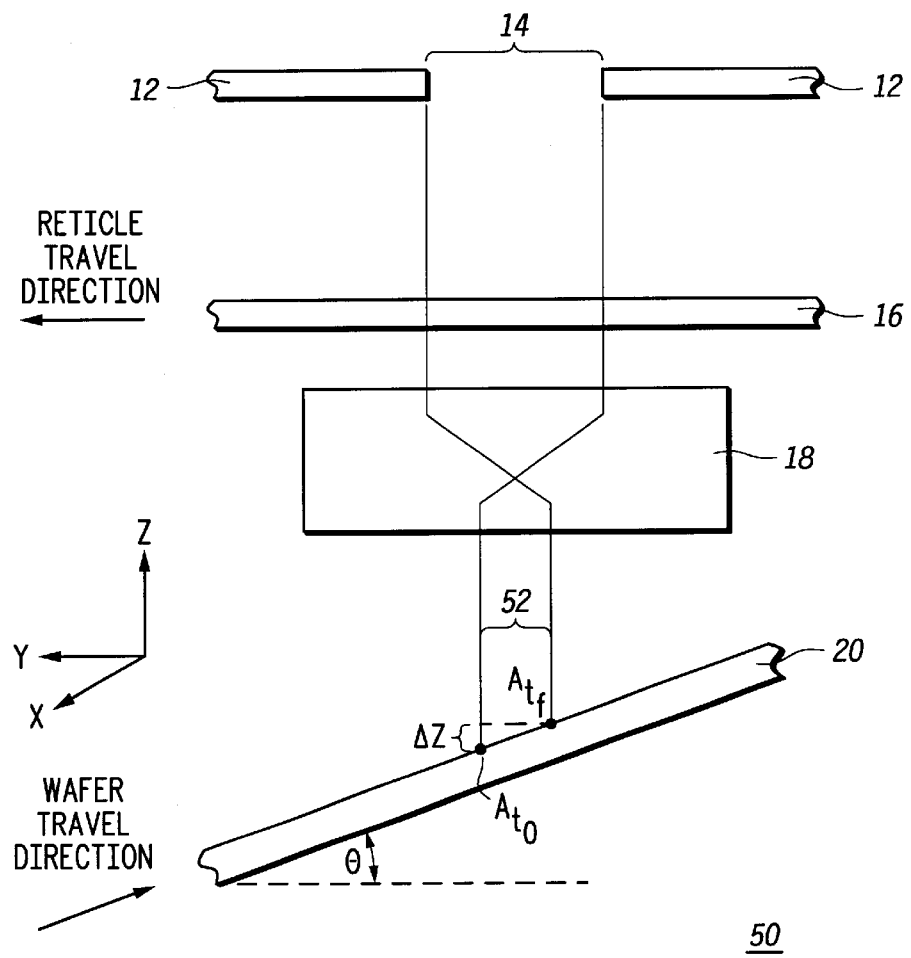
FIG. 3 illustrates a step and scan exposure system as used in accordance with the present invention.

An exposure process in accordance with the present invention is illustrated in reference to FIGS. 3–7. FIG. 3 illustrates a step and scan exposure system 50 in accordance with the present invention which includes many of the same elements as previously described in reference to FIG. 1. For example, system 50 includes mask blades 12 which form slit 14. System 50 also includes a reticle 16, a projection lens system 18 and a semiconductor wafer 20. As in a conventional step and scan process, both reticle 16 and wafer 20 are scanned or moved through the slit region during the exposure process. However, a significant difference with the present invention is that semiconductor wafer 20 is tilted about an axis perpendicular to the direction of scanning and perpendicular to the optical axis. For example in reference to FIG. 3, the scan direction is along the "Y" axis, and the optical axis is along the "Z" axis. The wafer is tilted about the "X" axis at an angle θ relative to the optimal plane of focus (i.e. the X-Y plane) as it is scanning the slit region. Not only is wafer 20 tilted during the scan, but its position along the optical axis is also continuously adjusted. In other words, the tilted wafer does not travel in a lateral direction parallel to the travel of the reticle, but rather in a direction which has both a lateral and a vertical component. It is noted that as shown angle θ is greatly exaggerated for purposes of illustration. How angle θ is determined and a value for θ as used in reducing the present invention to practice are discussed below, as is the extent of vertical position change of the wafer.

Figure 4:
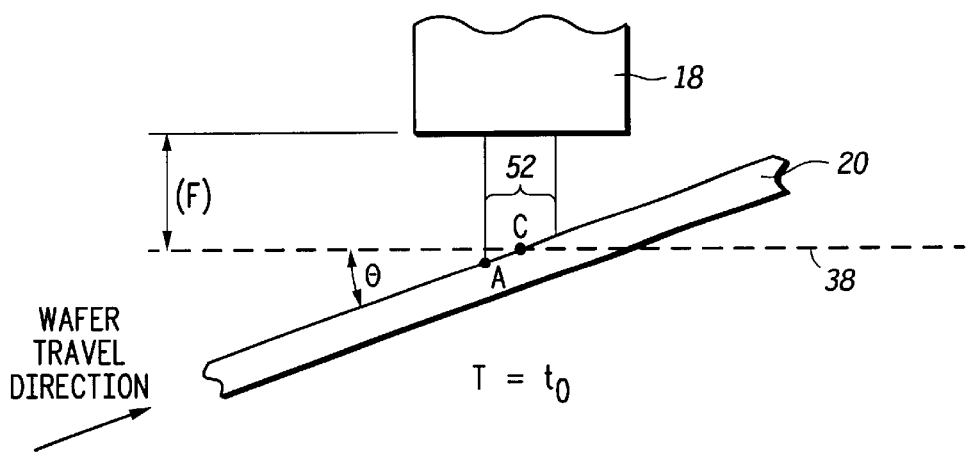
FIGS. 4–6 illustrate, in more detail, how a semiconductor wafer is scanned using the step and scan exposure system of FIG. 3 in accordance with the invention.
Figure 5:
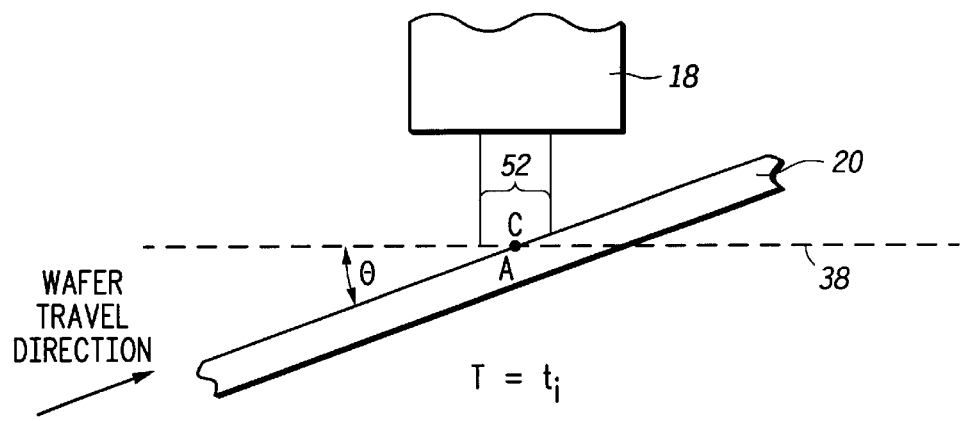
Figure 6:
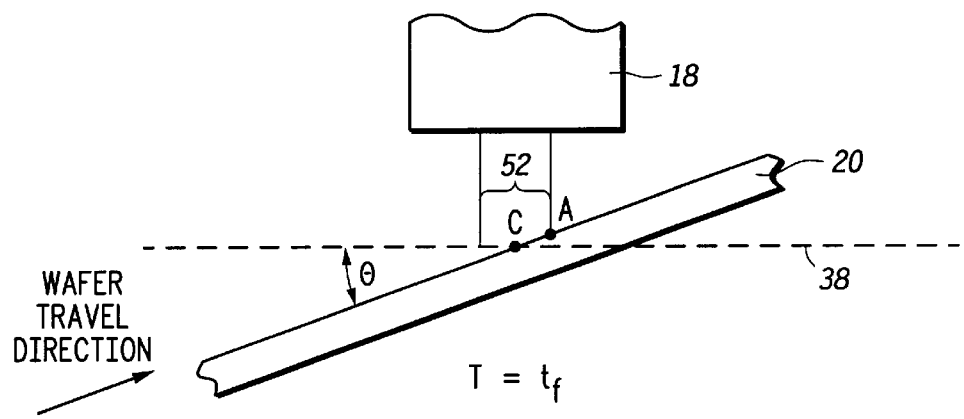

FIGS. 4–6 illustrate in a timed sequence the progression of the wafer movement through the slit region during an exposure process in accordance with the present invention. As illustrated in FIG. 4, a wafer 20 is tilted at an angle θ relative to an optimal plane of focus 38. This optimal plane of focus remains at a fixed distance (F) from lens system 18 throughout the process. At a time T=$t_0$ light is projected through lens system 18 and is concentrated within a projected slit region 52. The portion of semiconductor wafer 20 which is exposed to light within projected slit region 52 is seeing a varying degree of focus or image contrast. The wafer only sees the optimal focus at point C, which ideally corresponds to the center of projected slit region 52, and is the point where the wafer intersects the optimal focal plane.

Upon entering the illuminated slit region, a position A on semiconductor wafer 20 is exposed to a focus position which is offset from (as illustrated, below) the optimal plane of focus 38. However, as the wafer travels in the direction shown, point A on the wafer eventually is exposed at the center of projected slit region 52 and therefore at the optimal focus point. This time (T=$t_i$) is illustrated in FIG. 5. The wafer proceeds to travel through the projected slit region 52. At the end of the slit region (T=$t_f$), once again point A on semiconductor wafer 20 will be at a focus position offset from (as illustrated in FIG. 6, above) the optimal position defined by plane of focus 38. Accordingly, during the time period $t_0$ to $t_f$, each point within the image field area of the wafer is exposed to a range of focus, both above and below the optimal plane of focus.

This range of focus can also be viewed as the change in the vertical distance of point A from a time $t_0$ (which corresponds to the time in which point A enters the slit region) to a time $t_f$ (which is defined as the time in which point A exits the slit region). For purposes of discussion, this distance is defined as ΔZ. By scanning wafer 20 through a projected slit region 52 at a fixed tilt angle θ, while maintaining a constant focus value at the center C of the projected slit region 52, any point A on the wafer will traverse a vertical distance ΔZ during the exposure time. (See labels in FIG. 3.) This distance corresponds to a "sweep through" range of focus with resist layer 34, or in other words a range within the resist layer in which the optimal plane of focus passes. (See FIG. 7).

An optimum value for ΔZ is determined empirically through experimentation. ΔZ generally should correspond to the acceptable process "focus window" described above (i.e. the range in which the image contrast can be varied from the image contrast at the optimal focus point while still resulting in sufficient exposure of the resist to pattern all the contact openings). Once ΔZ is determined, θ is calculated according to the equation:

$$\Delta Z = S \cdot \tan \theta$$

where S equals the width of the projected slit region 52. ΔZ will likely vary from product to product and be dependent upon other variables such as the thickness of the resist layer being used, the desired feature size of the product being patterned, in addition to the illuminator and lens configuration of the step and scan exposure system.

In a particular example that was reduced to practice, a resist layer thickness of 0.4 μm (400 nanometers) was used to define a contact opening of 0.18 μm (180 nanometers) in diameter. Contact opening diameters are sometimes also referred to as "critical dimensions" or CDs. The resist used was a commercially available Deep Ultra-Violet (DUV) chemically amplified resist. The step and scan system used was an ASML 5500/700 model, with the dosage set at 34 milliJoules per square centimeter (mJ/cm$^2$). It is noted, however, that the particular dosage will be dependent on the particular resist used and its processing conditions (e.g. its bake parameters). Conventional engineering and experimentation should be used to determine the optimal dosage for a given resist material and its processing conditions. The projected slit width used was 5.5 mm (5500 μm). A ΔZ value was chosen to be 0.2 μm. This value was selected based on past empirical results obtained using a traditional FLEX process. The FLEX process was optimized to two different wafer positions which varied by 0.2 μm. This value was therefore used as a starting point for setting ΔZ in the present invention. It is noted, however, that ΔZ has not been optimized and that values both above and below 0.2 μm may well achieve similarly favorable results. For example, it is expected that ΔZ values between 0.1–1.0 μm should produce improvements in the depth of focus of a step and scan lithography process. With a ΔZ value of 0.2 μm, the tilt of the wafer (achieved by tilting the wafer stage of tool) was set to θ=38 μradians, as derived from the equation above.

It is noted that a wafer tilt as used in accordance with the present invention is in addition to the "normal" tilt which certain scanners may automatically perform to compensate for wafer warpage or severe topography across a die. In lithography operations the wafer is generally to be perpendicular to the axis of the optical path. But if the wafer is slightly warped or has a severe enough surface topography, this is not achieved even when the wafer is placed on a perfectly flat stage. Certain scanner tools have the capability of automatically tilting the stage to dynamically compensate for wafer warpage and topography during the scan. The warpage or surface topography is detected by leveling sensors during the exposure and are compensated for by adjusting the stage position. The stage position adjustments are accomplished by either tilting the wafer stage or by moving the wafer stage closer to or farther from the lens (i.e. in the vertical or Z direction). The amount of tilt or vertical position change is continuously calculated throughout the scan based on information from the leveling sensors. The goal or objective of such dynamic control is to maintain a constant or nominal focus throughout the scan. Thus, in such a prior art system, the position of the optimal focal plane within the resist is ideally constant.

In contrast, the present invention imposes a wafer tilt and a vertical stage movement in addition to the "normal" tilt and vertical stage movement which occur in maintaining a constant focus point (i.e. that which occurs to compensate for wafer warpage and severe surface topography). Through computer control, the tilt θ is added to the automatic "normal" tilt which the system might impose in an effort to maintain a constant focus. Similarly, the raising or lowering of the wafer staging during the scan is added to that which might otherwise occur to maintain a constant focus point. In contrast to the prior art, the additional tilt angle θ and the additional vertical movement of the wafer stage during the scan, as used in an embodiment of the present invention, produce a range of focus within the resist. In other words, the focus of the light is swept through a range of values or positions, as may be more clearly seen in reference to FIG. 7 below.

It is noted that while the "normal" tilt of a wafer is something which is "built-in" to some step and scan systems, tilting of the wafer as used in accordance with the present invention is not something which today's systems are designed to easily accommodate. For example, there is no "knob" on the system which enables an operator to "dial-in" a wafer tilt (θ) of 38 µradians. Instead, for example on the ASML tool, one has to enter the engineering mode of the tool in order to incorporate this tilt and to move the stage vertically during the scan above and beyond that used by the tool to accommodate for wafer warpage or severe topography. The tool is, however, capable of being configured this way. It is simply not the intended use of the tool, and therefore is not set-up as a user feature.

Figure 7:
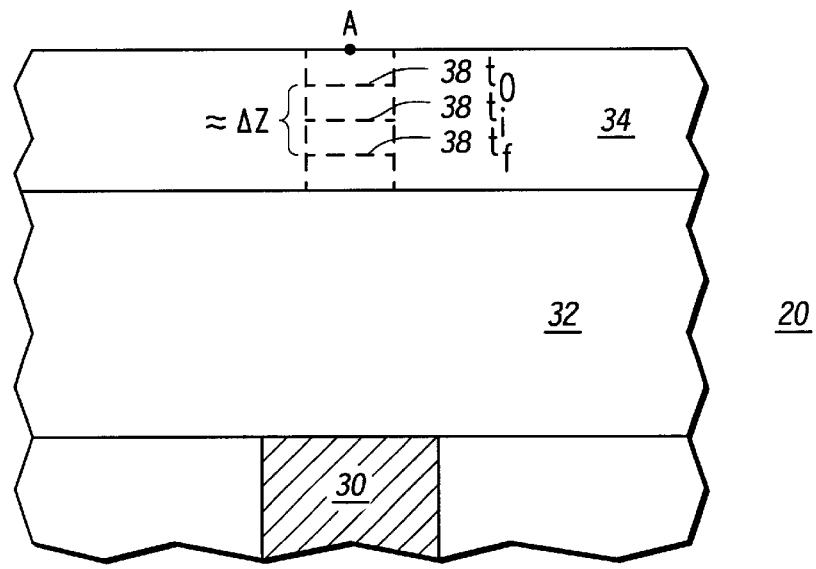
FIG. 7 is a cross-sectional view of a portion of a semiconductor wafer demonstrating the effects of using the step and scan exposure system of FIG. 3.

FIG. 7 is a cross-section of a semiconductor wafer 20 depicting where the optimal plane of focus 38 occurs during the scanning process described in FIGS. 4–6. At time $t_0$, point A lies below the optimal plane of focus (see FIG. 4), meaning that only the uppermost portions of the resist layer at this point will be at best focus. At time $t_i$, point A coincides with point C (see FIG. 5), so that the optimal plane of focus is ideally near the middle of the resist layer. Then at time $t_f$, point A lies above the optimal plane of focus (see FIG. 6), so that the lower most portions of the resist are at best focus. In contrast to the prior art step and scan process (as represented in FIG. 2), with the present invention the depth of focus is broaden by varying the position of the optimal plane of focus within the resist layer during the scan process. Thus, there is a range of focus during the scan. Stated otherwise, the focus is sweeping through the range ΔZ within the resist layer 34.

Figure 8:
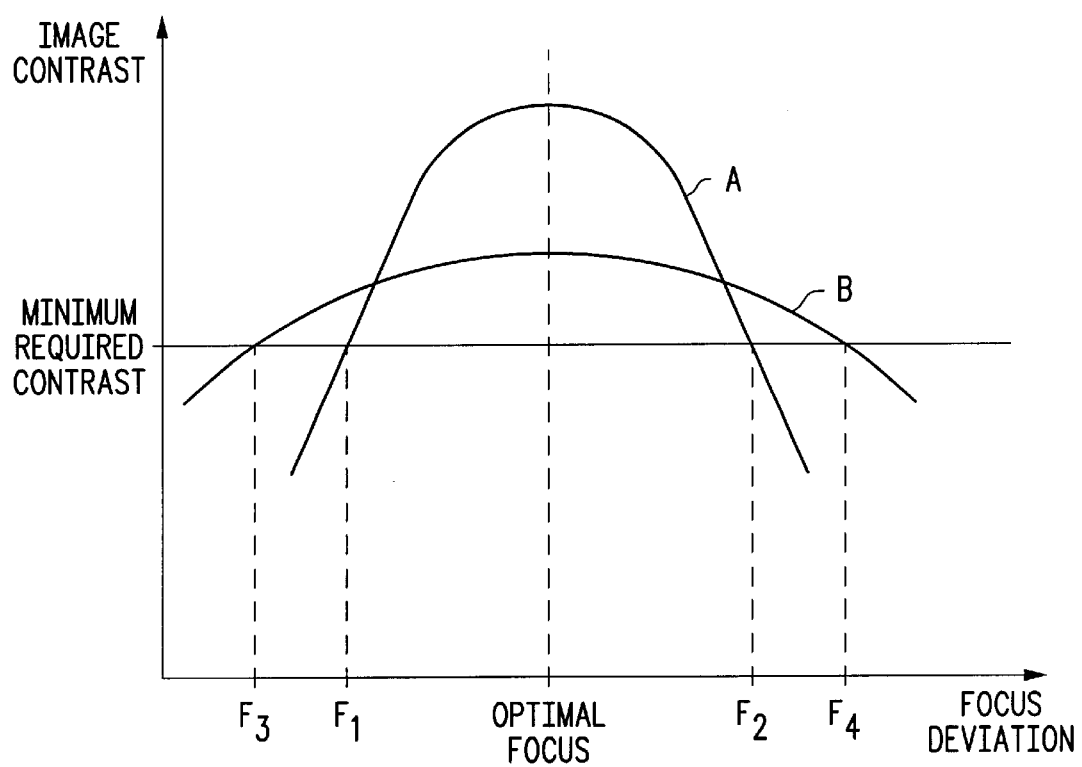
FIG. 8 is a graph depicting an advantage achieved by practicing the present invention, namely broadening a window of acceptable focus deviation in an exposure process.

A significant benefit of the present invention over conventional step and scan processes is obtained as follows. By scanning or sweeping through an "acceptable window" of focus positions during exposure (with the center of the range being the optimal focus position), sufficient image contrast can be maintained over an increased range of focus deviation. Focus deviation as used herein is a broad term that in general covers any type of variation in the process which causes the image to be exposed at a focus position other than the optimum position. This encompasses things such as differences in topography across the wafer, difference in total resist thicknesses, deviations in focus settings on the equipment and the like. This benefit may be better understood in reference to FIG. 8 which is a graphical illustration which plots image contrast as a function of focus deviation. To achieve a minimum required image contrast using conventional step and scan techniques (Curve A), an acceptable focus deviation is defined as the region between points F1 and F2. In comparison, a scanning exposure technique used in accordance with the present invention is illustrated in FIG. 8 by curve B. Again, by scanning through a range of focus positions during the exposure, an acceptable image contrast can be maintained over a greater extent of focus deviation. With respect to FIG. 8, this is demonstrated by points F3 and F4. Because the range of F3–F4 is larger than that of F1–F2, there is larger focus latitude in the exposure process of the present invention as compared to the prior art.

A specific example of the improvement achieved by practicing the present invention will now be described. The exposure parameters are as set forth previously (0.4 µm resist thickness using a DUV chemically amplified resist, desired contact opening diameter of 0.18 µm, ASML 5500/700 step and scan system, dosage of 34 mJ/cm², projected slit width of 5.5 mm, and θ=38 µradians). Under these conditions a depth of focus for the exposure operation was determined to be 0.7 µm (meaning that contact openings were adequately defined in the resist layer over a range of the focal plane distance from the lens spanning 0.7 µm). By contrast, a depth of focus of 0.4 µm was obtained using a conventional exposure process with no wafer tilt but otherwise under the same operating conditions. It is noted that for the "intermediate" half-pitch node between the 1180 nm and 130 nm nodes defined by the 1999 edition of the ITRS (which is sometimes also referred to as the 150 nm node), the critical contact dimension is 0.18 µm, so these results prove the viability of the present invention for use with this node and perhaps beyond.

After scanning a particular field or die of semiconductor wafer in accordance with the invention as described above, the process can be repeated for each additional field area or die on the wafer. With the ASML tool mentioned above, the distance from the lens to point C (the point on the wafer corresponding to the center of the slit region) can be fixed during the scanning process. In other words, the tool operation can be programmed to automatically adjust the wafer stage height (at a rate in proportion to the magnitude of stage tilt introduced) to maintain this distance as fixed. Therefore, when stepping to the next field area or die prior to its exposure, the tool can automatically raise (or lower) the wafer as needed to maintain the same desired focus range during the scanning process, in addition to moving the wafer laterally. The actual action (raising or lowering) will depend on whether successive fields are exposed with alternating directions of scanning. Again, as with the required wafer tilt, the associated stage position adjustments in moving from field to field which may be needed in practicing the invention, are not a standard user feature that can be selected in today's step and scan systems. An engineering mode override is likely to be needed until tool manufacturers integrate this into their systems.

Thus it is apparent that there has been provided a method for patterning a resist layer in a semiconductor manufacturing process which achieves the desired advantages discussed above. Although the invention has been described with reference to a specific embodiment, one of ordinary skill in this field will recognize that variations and modifications can be made to this embodiment without departing from the essence of the invention. For example, while the invention was described with reference specifically to making a semiconductor device, photolithography techniques are used in other, but related, areas, such as liquid crystal display and thin-film magnetic head manufacturing. The principles and advantages of the invention are equally applicable to these and similar areas. Also, while the invention has been described with reference to formation of contact openings in a dielectric layer, the invention is not limited to any particular lithography step in a manufacturing operation. The contact opening lithography operation is viewed as a critical operation and one which generally tests the limits of lithography capabilities. Therefore, patterning contact openings is the operation which has the potential of having the most benefit from this invention at the present time. However, any lithography operation can be performed using the methods herein described. It is also noted that the invention is not limited to a particular time when the substrate stage is tilted (e.g. before, during, or after placing the wafer thereon). Moreover, the invention is not limited to any particular wavelength of light used to alter the resist during exposure. Furthermore, although the invention has been described for use in conjunction with step and scan systems configured with horizontally mounted stages, the same principle can be applied to those configured with vertically mounted stages, such as the Micrascan models produced by SVG Lithography. Accordingly, the invention is to cover all such variations and modifications to the described embodiment as fall literally, and under all doctrines of equivalency, within the scope of the appended claims.

What is claimed is:

1. A method for patterning resist, comprising:

forming a layer of resist over a substrate;

providing a reticle;

providing a light source;

passing light through the reticle to produce a projected image; and exposing the substrate to the projected image while the reticle is moving in a first direction and while the substrate is moving in a second direction, wherein:

the second direction includes a tilt angle so that a focus of the projected image within the layer of resist changes position as the substrate moves in the second direction.

2. The method of claim 1 wherein the light source establishes an optical axis, and wherein the second direction further includes a component which is parallel to the optical axis.

3. The method of claim 2 further comprising:

forming a dielectric layer over the substrate prior to forming the layer of resist; and etching the dielectric layer to form a contact opening after the layer of resist has been exposed to the light source.

4. The method of claim 2 wherein:

a predetermined area of the layer of resist is exposed to the projected image for a predetermined travel distance of the substrate in the second direction and a tangent of the tilt angle is a desired change in focus divided by the predetermined travel distance.

5. The method of claim 1 wherein the tilt angle is between approximately 20 and 200 microradians.

6. A method of making a semiconductor device, comprising:

providing a semiconductor substrate;

forming a resist layer over the semiconductor substrate;

establishing a pattern of light having a focal plane; and passing the semiconductor substrate with the resist layer through the focal plane at a tilt angle with respect to the focal plane, the tilt angle establishing a range of focus with the resist layer.

7. The method of claim 6 further comprising providing a reticle to establish the pattern of light, and moving the reticle while passing the semiconductor substrate through the focal plane.

8. The method of claim 7 wherein:

the resist layer has a bottom surface and a top surface;

the resist layer passes through the focal plane between a first distance below the top surface and a second distance below the top surface;

the first distance and the second distance are different and above the bottom surface; and a span between the first and second distances corresponds to the range of focus.

9. The method of claim 8 wherein the pattern of light has a corresponding slit width and wherein the tilt angle is an arc tangent of a difference between the first distance and the second distance divided by the corresponding slit width.

10. The method of claim 6 wherein passing the semiconductor substrate comprises:

placing the semiconductor substrate on a stage;

tilting the stage at the tilt angle; and moving the stage with the semiconductor substrate thereon in a direction having a first component and a second component, the first component being generally perpendicular to an optical axis of the pattern of light and the second component being generally parallel to the optical axis.

11. The method of claim 10 wherein the tilt angle is between approximately 20 and 200 microradians.

12. The method of claim 10, further comprising:

forming a conductive region over the semiconductor substrate prior to forming the resist layer;

forming a dielectric layer over the conductive region prior to forming the resist layer; and developing the resist layer to create a pattern therein which corresponds to the pattern of light, the pattern defining a contact opening, and etching the dielectric layer so that the contact opening in the patterned resist layer is transferred into the dielectric layer and exposes the conductive region.

13. The method of claim 10, wherein the resist layer is exposed to a slit of light having a slit width, the slit of light illuminates an illuminated portion of the semiconductor substrate at a surface of the resist layer, the illuminated portion has a center location, and the center location is maintained at a fixed distance from a lens as the semiconductor substrate passes through the slit of light.

14. A method for patterning a resist layer having a substantially planar surface over a semiconductor substrate, comprising:

moving a reticle though a light source to pass patterned light;

focusing the patterned light at a focal plane; and passing the semiconductor substrate through the focal plane in a manner that the substantially planar surface of the resist layer is at a tilt angle to the focal plane to expand a depth of focus of the patterned light over a range within the resist layer.

15. The method of claim 14, wherein the patterned light at the focal plane has a slit width, and further comprising:

selecting a desired range of focus; and choosing the tilt angle to be an arc tangent of selected range of focus divided by the slit width.

16. The method of claim 14, wherein the range of focus is about 0.1 to 1.0 microns.

17. The method of claim 14, wherein the tilt angle is about 20–200 microradians.

18. The method of claim 14 wherein passing the wafer comprises moving the wafer in a direction having a first component and a second component, the first component being generally perpendicular to an optical axis of the patterned light and the second component being generally parallel to the optical axis.

* * * * *